United States Patent
Hikosaka et al.

(10) Patent No.: US 12,501,637 B2
(45) Date of Patent: Dec. 16, 2025

(54) NITRIDE SEMICONDUCTOR AND SEMICONDUCTOR DEVICE

(71) Applicant: KABUSHIKI KAISHA TOSHIBA, Tokyo (JP)

(72) Inventors: Toshiki Hikosaka, Kawasaki (JP); Hajime Nago, Yokohama (JP); Hisashi Yoshida, Kawasaki (JP); Jumpei Tajima, Mitaka (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 618 days.

(21) Appl. No.: 17/884,620

(22) Filed: Aug. 10, 2022

(65) Prior Publication Data
US 2023/0290857 A1 Sep. 14, 2023

(30) Foreign Application Priority Data

Mar. 10, 2022 (JP) .................................. 2022-036877

(51) Int. Cl.
*H10D 30/01* (2025.01)
*H10D 30/47* (2025.01)
*H10D 62/85* (2025.01)

(52) U.S. Cl.
CPC .......... *H10D 30/015* (2025.01); *H10D 30/47* (2025.01); *H10D 62/8503* (2025.01)

(58) Field of Classification Search
None
See application file for complete search history.

(56) References Cited

U.S. PATENT DOCUMENTS

| | | | |
|---|---|---|---|
| 8,546,167 B2 | 10/2013 | Kato et al. | |
| 10,186,588 B1* | 1/2019 | Kato | .................. H10D 30/475 |
| 2013/0234151 A1 | 9/2013 | Hikosaka et al. | |
| 2021/0273057 A1* | 9/2021 | Hikosaka | .......... H01L 21/02389 |

FOREIGN PATENT DOCUMENTS

| | | |
|---|---|---|
| JP | 2011-151275 A | 8/2011 |
| JP | 2011-258782 A | 12/2011 |
| JP | 4891462 B2 | 3/2012 |
| JP | 2013-187427 A | 9/2013 |
| JP | 2020-098939 A | 6/2020 |
| JP | 2021-134122 A | 9/2021 |

OTHER PUBLICATIONS

Japanese Office Action issued Feb. 17, 2025 in Japanese Patent Application 2022-036877 (with unedited computer-generated English translation), 10 pages.

* cited by examiner

*Primary Examiner* — Sarah K Salerno
(74) *Attorney, Agent, or Firm* — Oblon, McClelland, Maier & Neustadt, L.L.P.

(57) ABSTRACT

According to one embodiment, a nitride semiconductor includes a nitride member. The nitride member includes a first nitride region including $Al_{x1}Ga_{1-x1}N$ (0<x1≤1), a second nitride region including $Al_{x2}Ga_{1-x2}N$ (0≤x2<1), and an intermediate region being between the first nitride region and the second nitride region. In a first direction from the first nitride region to the second nitride region, an oxygen concentration in the nitride member has a peak value at a first position included in the intermediate region. The peak value is 4.9 times or more a first oxygen concentration in the first nitride region. A second carbon concentration in the second nitride region is higher than a first carbon concentration in the first nitride region.

19 Claims, 9 Drawing Sheets

NITRIDE SEMICONDUCTOR AND SEMICONDUCTOR DEVICE

CROSS-REFERENCE TO RELATED APPLICATIONS

This application is based upon and claims the benefit of priority from Japanese Patent Application No. 2022-036877, filed on Mar. 10, 2022; the entire contents of which are incorporated herein by reference.

FIELD

Embodiments of the invention generally relate to a nitride semiconductor and a semiconductor device.

BACKGROUND

For example, it is desirable to improve the characteristics of a semiconductor device such as a transistor or the like.

DETAILED DESCRIPTION

Figure 1:
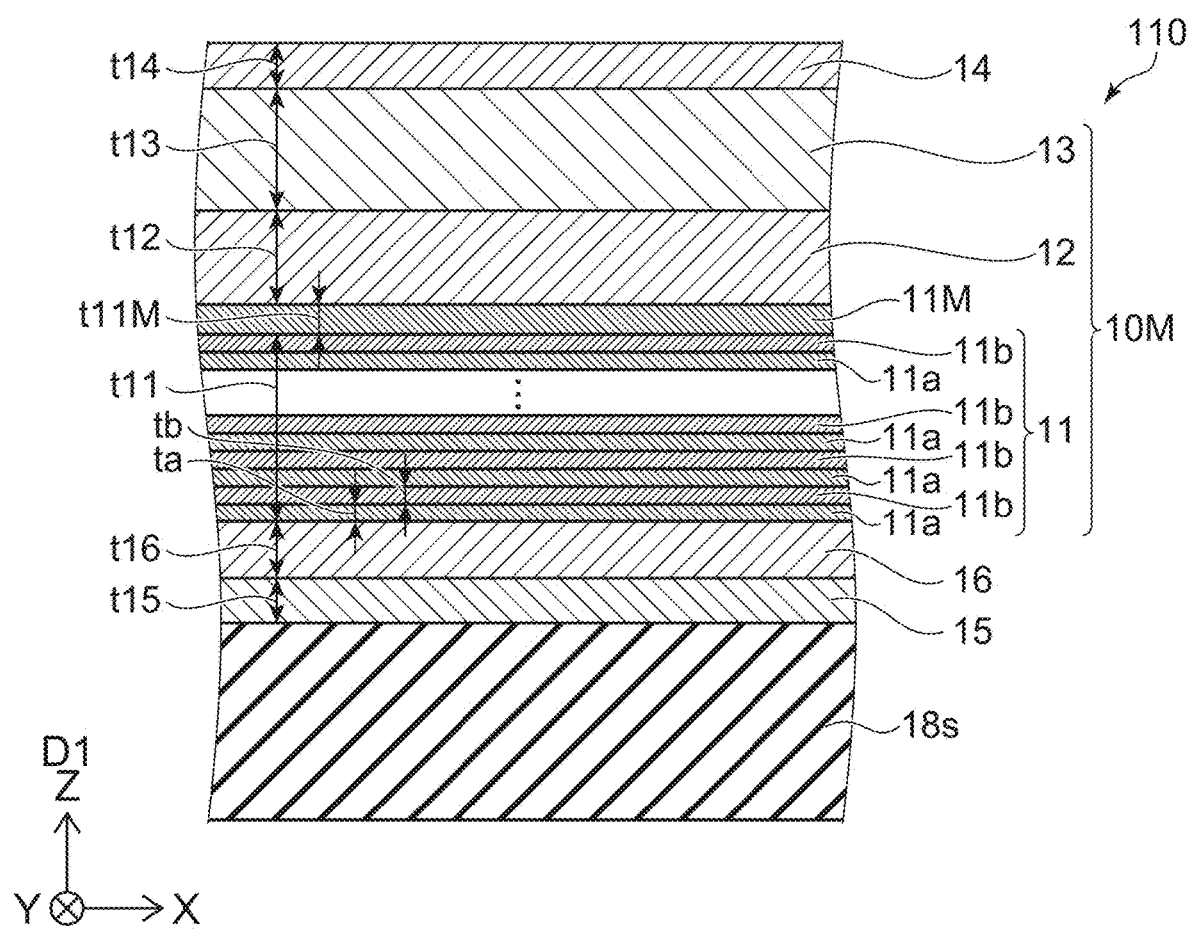
FIG. 1 is a schematic cross-sectional view illustrating a nitride semiconductor according to the first embodiment.

According to one embodiment, a nitride semiconductor includes a nitride member. The nitride member includes a first nitride region including $Al_{x1}Ga_{1-x1}N$ ($0<x1\leq1$), a second nitride region including $Al_{x2}Ga_{1-x2}N$ ($0\leq x2<1$), and an intermediate region being between the first nitride region and the second nitride region. In a first direction from the first nitride region to the second nitride region, an oxygen concentration in the nitride member has a peak value at a first position included in the intermediate region. The peak value is 4.9 times or more a first oxygen concentration in the first nitride region. A second carbon concentration in the second nitride region is higher than a first carbon concentration in the first nitride region.

According to one embodiment, a semiconductor device includes a nitride semiconductor described above, a first electrode, a second electrode, a third electrode, and an insulating member. The nitride semiconductor further includes a fourth nitride region including $Al_{x4}Ga_{1-x4}N$ ($0<x4\leq1$, $x3<x4$). The third nitride region is between the second nitride region and the fourth nitride region in the first direction. A direction from the first electrode to the second electrode is along a second direction crossing the first direction. A position of the third electrode in the second direction is between a position of the first electrode in the second direction and a position of the second electrode in the second direction. The third nitride region includes a first partial region, a second partial region, a third partial region, a fourth partial region, and a fifth partial region. A direction from the first partial region to the first electrode is along the first direction. A direction from the second partial region to the second electrode is along the first direction. The third partial region is located between the first partial region and the second partial region in the second direction, and a direction from the third partial region to the third electrode is along the first direction. The fourth partial region is located between the first partial region and the third partial region in the second direction. The fifth partial region is located between the third partial region and the second partial region in the second direction. The fourth nitride region includes a sixth partial region and a seventh partial region. A direction from the fourth partial region to the sixth partial region is along the first direction. A direction from the fifth partial region to the seventh partial region is along the first direction. The insulating member is between the nitride member and the third electrode.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a nitride semiconductor according to the first embodiment.

As shown in FIG. 1, a nitride semiconductor 110 according to the embodiment includes a nitride member 10M.

The nitride member 10M includes a first nitride region 11, a second nitride region 12, and an intermediate region 11M.

The first nitride region 11 includes $Al_{x1}Ga_{1-x1}N$ ($0<x1\leq1$). The first nitride region 11 includes, for example, AlGaN. For example, the composition ratio of Al in the first nitride region 11 is, for example, not less than 0.05 and not more than 0.6. As shown in FIG. 1, the first nitride region 11 may have a laminated structure. In this case, the effective (for example, average) composition ratio of Al in the first nitride region 11 is, for example, not less than 0.15 and not more than 0.55. An example of the laminated structure will be described later.

The second nitride region 12 includes $Al_{x2}Ga_{1-x2}N$ ($0\leq x2<1$). The composition ratio of Al in the second nitride region 12 is, for example, not less than 0 and not more than 0.25. The second nitride region 12 includes, for example, GaN. The second nitride region 12 includes carbon.

An intermediate region 11M is provided between the first nitride region 11 and the second nitride region 12. The intermediate region 11M includes oxygen and carbon.

A first direction D1 from the first nitride region 11 to the second nitride region 12 is a Z-axis direction. One direction perpendicular to the Z-axis direction is defined as an X-axis direction. The direction perpendicular to the Z-axis direction and the X-axis direction is defined as a Y-axis direction. The first nitride region 11 and the second nitride region 12 are layered along the X-Y plane.

In this example, the nitride member 10M includes a third nitride region 13. The third nitride region 13 includes $Al_{x3}Ga_{1-x3}N$ (0≤x3<1). In the first direction D1, the second nitride region 12 is located between the intermediate region 11M and the third nitride region 13. The composition ratio of Al in the third nitride region 13 is, for example, not less than 0 and not more than 0.25. The third nitride region 13 includes, for example, GaN. The third nitride region 13 substantially does not include carbon. Alternatively, the concentration of carbon in the third nitride region 13 is lower than the concentration of carbon in the second nitride region 12.

Figure 2:
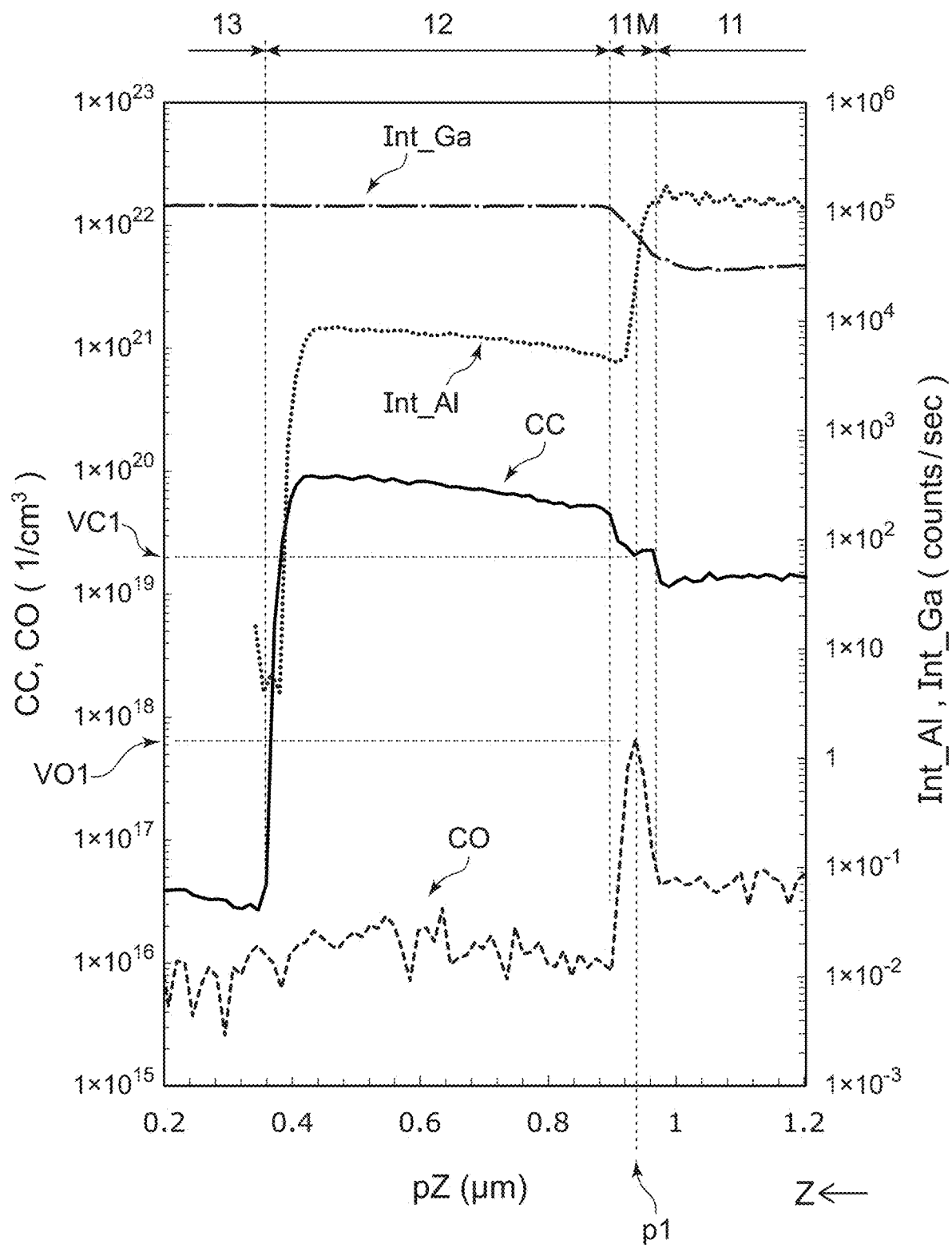
FIG. 2 is a graph illustrating the nitride semiconductor according to the first embodiment.

FIG. 2 is a graph illustrating the nitride semiconductor according to the first embodiment.

FIG. 2 illustrates a result of SIMS (Secondary Ion Mass Spectrometry) analysis of the nitride member 10M. The horizontal axis of FIG. 2 is the position pZ in the Z-axis direction. The vertical axis on the left side of FIG. 2 is the carbon concentration CC and the oxygen concentration CO. The vertical axis on the right side of FIG. 2 is the detection intensity Int_Al of the secondary ion of Al and the detection intensity Int_Ga of the secondary ion of gallium.

As shown in FIG. 2, the oxygen concentration CO in the nitride member 10M has a peak value of VO1 at the first position p1 included in the intermediate region 11M. In this example, the peak value VO1 is about $6.6 \times 10^{17}/cm^3$.

The peak value VO1 is higher than the oxygen concentration CO (first oxygen concentration) in the first nitride region 11. The peak value VO1 is higher than the oxygen concentration CO (second oxygen concentration) in the second nitride region 12. For example, the peak value VO1 is 4.9 times 10 or more the first oxygen concentration. For example, the peak value VO1 is 18 times or more the second oxygen concentration.

As shown in FIG. 2, the carbon concentration CC (second carbon concentration) in the second nitride region 12 is higher than the carbon concentration CC (first carbon concentration) in the first nitride region 11. For example, the carbon concentration VC1 at the first position p1 is between the first carbon concentration and the second carbon concentration.

It was found that a defect density in the nitride member 10M can be reduced by such oxygen concentration CO and carbon concentration CC.

As shown in FIG. 2, the concentration (composition ratio) of Al in the second nitride region 12 is lower than the concentration of Al in the first nitride region 11. The concentration (composition ratio) of Al decreases in the direction from the first nitride region 11 to the second nitride region 12. For example, the intermediate region 11M includes aluminum. The concentration of aluminum (first aluminum concentration) at the first position p1 is lower than the concentration of aluminum in the first nitride region 11. The second nitride region 12 does not include aluminum. Alternatively, the concentration (second aluminum concentration) of aluminum in the second nitride region 12 is equal to or less than the concentration of aluminum in the first position p1. By providing such an intermediate region 11M in which the oxygen concentration CO becomes a peak, the defect density can be reduced.

Experimental results will be explained below.

In the experiment, the nitride member 10M is formed by MOCVD (Metal Organic Chemical Vapor Deposition). In the experiment, the intermediate region 11M is formed on the first nitride region 11 at about 940° C. In the formation of the intermediate region 11M, a raw material gas including TMGa (Trimethyl Gallium), TMAI (Trimethyl Aluminum), $C_2H_2$ and ammonia is supplied in a hydrogen atmosphere. In this example, the raw material gas includes oxygen. By controlling the amount of oxygen supplied, the oxygen concentration CO in the intermediate region 11M can be controlled.

The second nitride region 12 is formed on the intermediate region 11M at about 940° C. In the formation of the second nitride region 12, TMGa and ammonia are supplied in a hydrogen atmosphere. By forming the second nitride region 12 at a low temperature, the second nitride region 12 including carbon can be obtained.

The third nitride region 13 is formed on the second nitride region 12 at about 1040° C. In the formation of the third nitride region 13, TMGa and ammonia are supplied in a hydrogen atmosphere. By forming the third nitride region 13 at a high temperature, the third nitride region 13 including substantially no carbon can be obtained.

Figure 3:
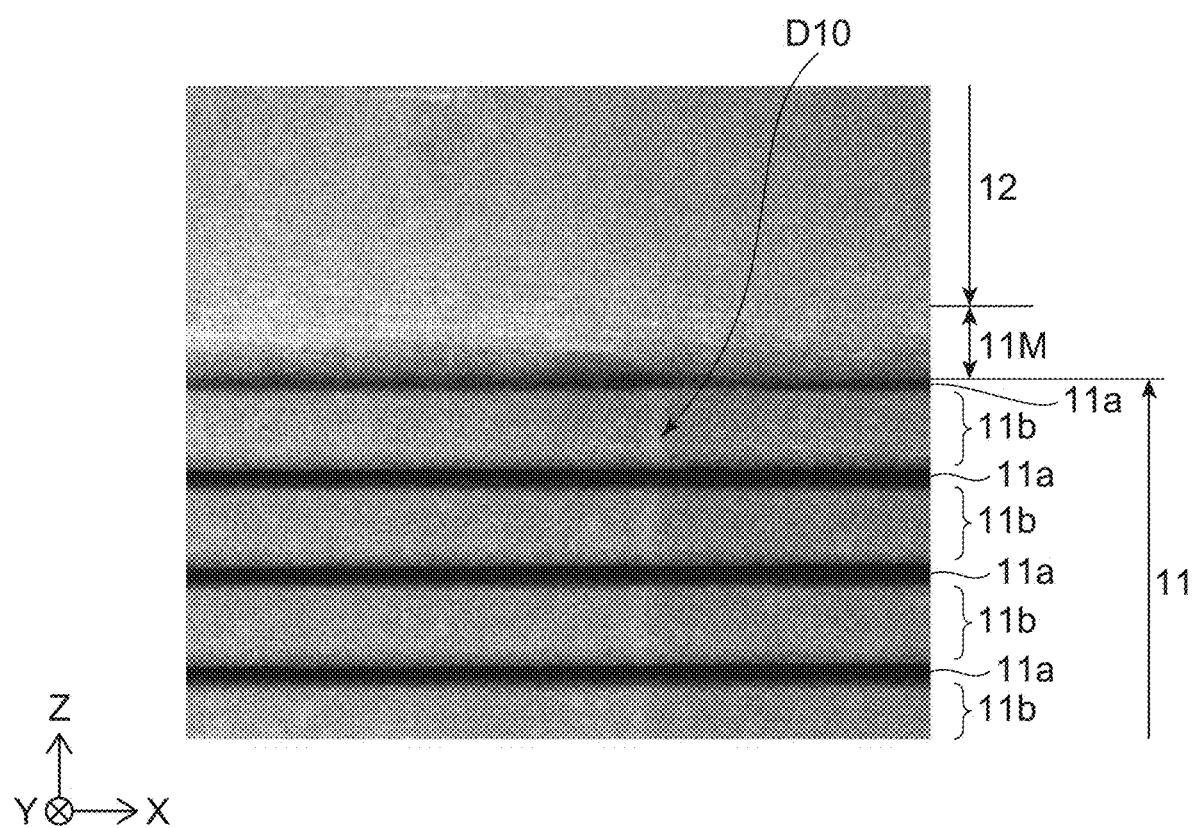
FIG. 3 is an electron microscope image of the nitride semiconductor according to the first embodiment.

FIG. 3 is an electron microscope image of the nitride semiconductor according to the first embodiment.

FIG. 3 is a cross-sectional TEM (Transmission Electron Microscope) image of one of the samples prepared in the experiment. As shown in FIG. 3, there is the intermediate region 11M above the first nitride region 11. The second nitride region 12 is provided on the intermediate region 11M. It can be seen that a dislocation D10 existing in the first nitride region 11 is bent in the intermediate region 11M. By providing the intermediate region 11M reduces defects in the second nitride region 12 (and the third nitride region 13 above the second nitride region 12).

For example, the defect density in the second nitride region 12 is lower than the defect density in the first nitride region 11. For example, the defect density in the third nitride region 13 is lower than the defect density in the first nitride region 11. Information on the defect density may be obtained, for example, from a cross-sectional TEM image of the nitride member 10M. By providing the intermediate region 11M reduces, for example, dislocations in the second nitride region 12 (and the third nitride region 13 above the second nitride region 12). For example, the dislocation density in the second nitride region 12 is lower than the dislocation density in the first nitride region 11. For example, the dislocation density in the third nitride region 13 is lower than the dislocation density in the first nitride region 11.

Hereinafter, a relationship between the peak value VO1 of the oxygen concentration CO and the defect density will be described.

Figure 4:
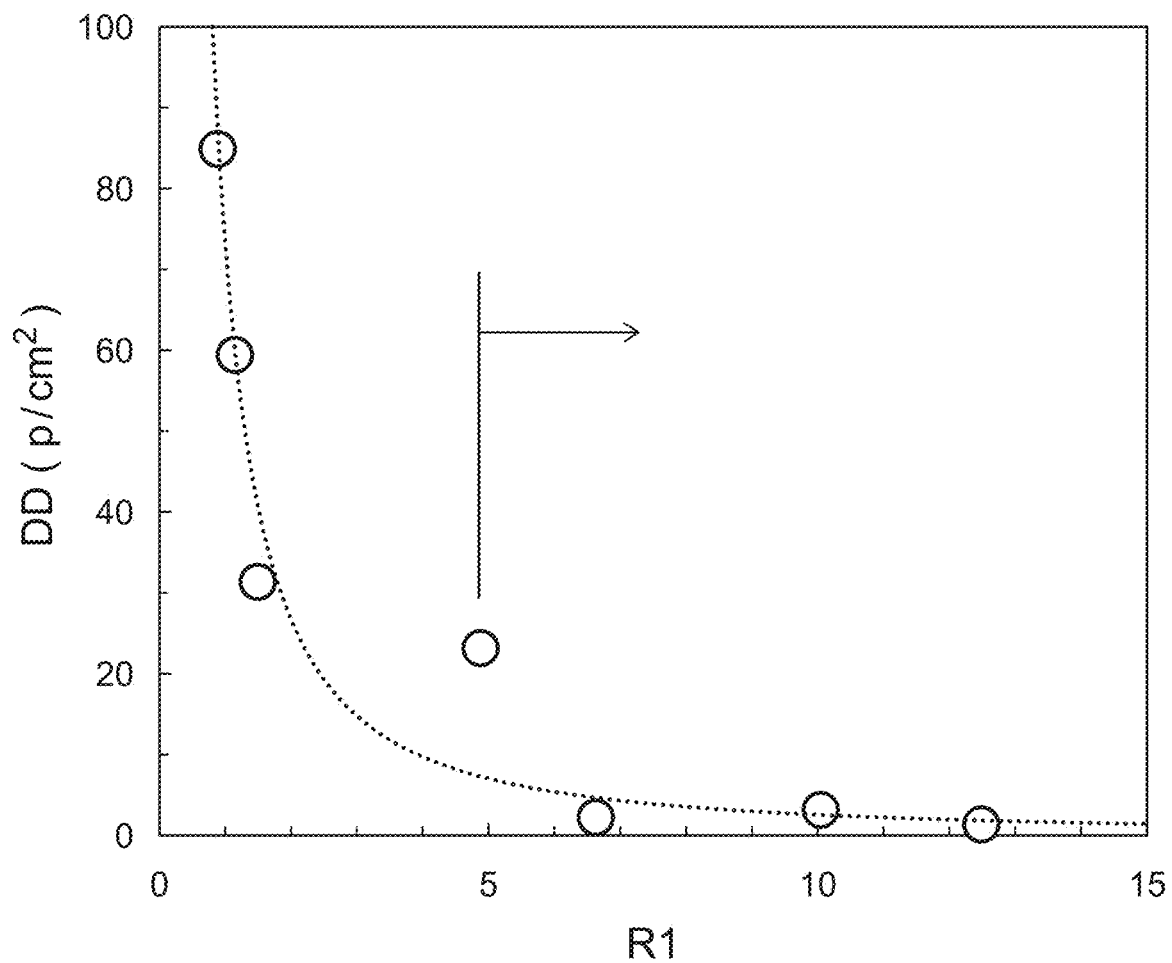
FIG. 4 is a graph illustrating the characteristics of the nitride semiconductor.

FIG. 4 is a graph illustrating the characteristics of the nitride semiconductor.

The horizontal axis in FIG. 4 is a first ratio R1. The first ratio R1 is a ratio of the peak value VO1 at the first position p1 to the first oxygen concentration in the first nitride region 11. The vertical axis of FIG. 4 is the defect density DD.

In this example, the defect density DD is evaluated by the following method. An electrode is formed on the nitride member 10M. A voltage between the electrode and the base body 18s (see FIG. 1) is changed, and a current flowing between the electrode and the base body 18s is measured at that time. This voltage-current characteristic measurement is performed on a plurality of evaluation elements. Defects such as current leakage occur in any of the plurality of evaluation elements to be evaluated. An element in which the defect occurs corresponds to a defective element. A ratio (yield Y) of a number of the defective elements to a number of the plurality of evaluation elements to be evaluated is calculated. The defect density DD is calculated by a relational expression of Y=exp (−DD×S) based on the yield Y and an area S of the electrodes.

As shown in FIG. 4, the higher the first ratio R1, the lower the defect density DD. When the first ratio R1 is 4.9 or more, the defect density DD becomes critically low. The first ratio R1 is preferably 4.9 or more. In the embodiment, the peak value VO1 is preferably 4.9 times or more the first oxygen concentration in the first nitride region 11. Defects can be effectively suppressed.

Figure 5:
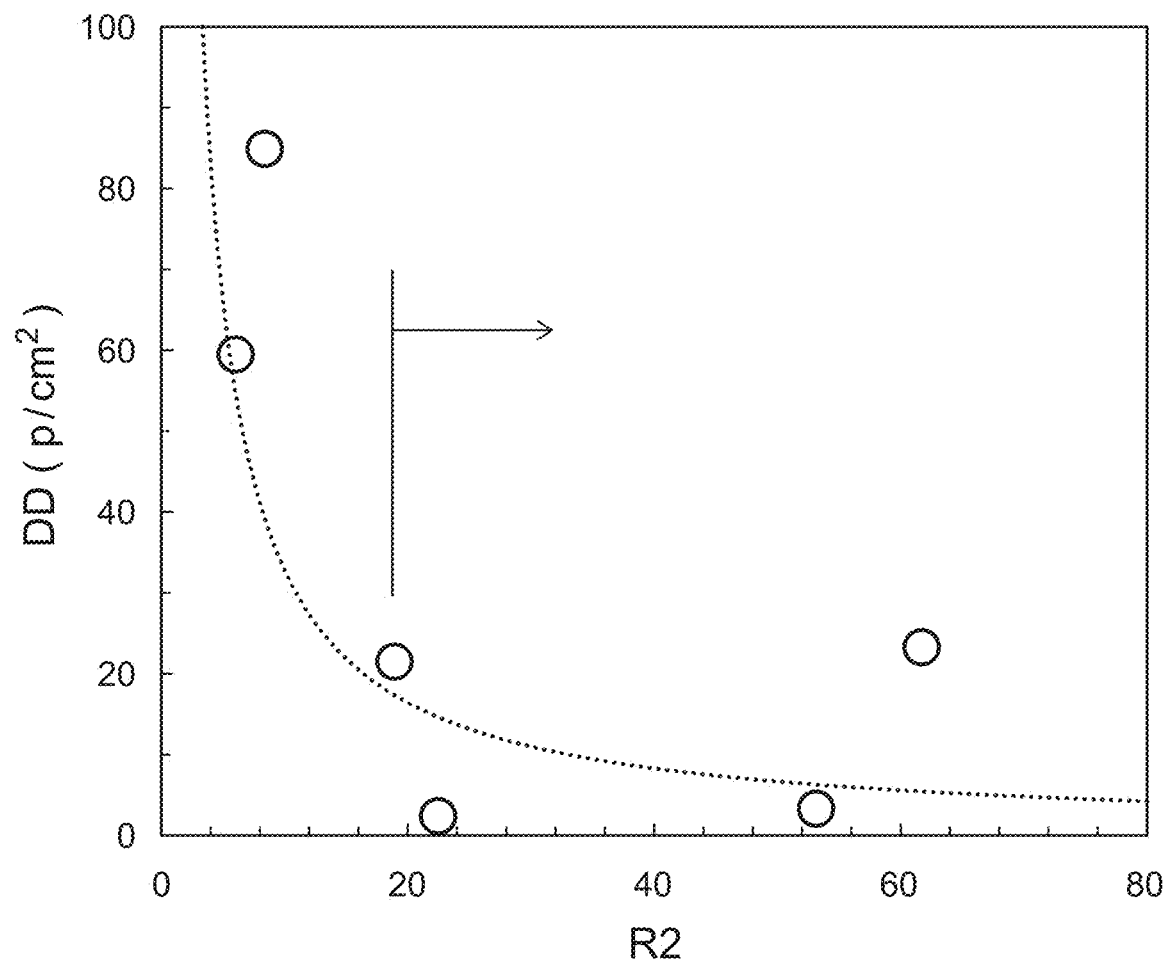
FIG. 5 is a graph illustrating the characteristics of the nitride semiconductor.

FIG. 5 is a graph illustrating the characteristics of the nitride semiconductor.

The horizontal axis in FIG. 5 is a second ratio R2. The second ratio R2 is a ratio of the peak value VO1 at the first position p1 to the second oxygen concentration in the second nitride region 12. The vertical axis of FIG. 5 is the defect density DD.

As shown in FIG. 5, the higher the second ratio R2, the lower the defect density DD. When the second ratio R2 is 18 or more, the defect density DD becomes critically low. The second ratio R2 is preferably 18 or more. In the embodiment, the peak value VO1 is preferably 18 times or more the second oxygen concentration in the second nitride region 12. Defects can be effectively suppressed.

As described above, in the intermediate region 11M, the oxygen concentration CO peaks, so that the defects are effectively reduced. The decrease in defects is considered to be based on, for example, an intensive change in the propagation direction of the dislocation D10 in the intermediate region 11M. For example, oxygen impedes the propagation of dislocations. It is considered that this effect reduces defects. For example, it is considered that oxygen reduces defects by increasing lateral growth in the growth of the second nitride region 12.

In the embodiment, the carbon concentration CC changes in the intermediate region 11M. The concentration (composition ratio) of Al changes in the intermediate region 11M. As described above, the intermediate region 11M is a transition region in which the carbon concentration CC and/or the Al concentration changes. It is considered that the dislocation D10 can be effectively bent by locally increasing the oxygen concentration CO in the transition region. As a result, the crystallinity of the second nitride region 12 is improved. For example, the dislocation D10 is reduced in the second nitride region 12.

Figure 6:
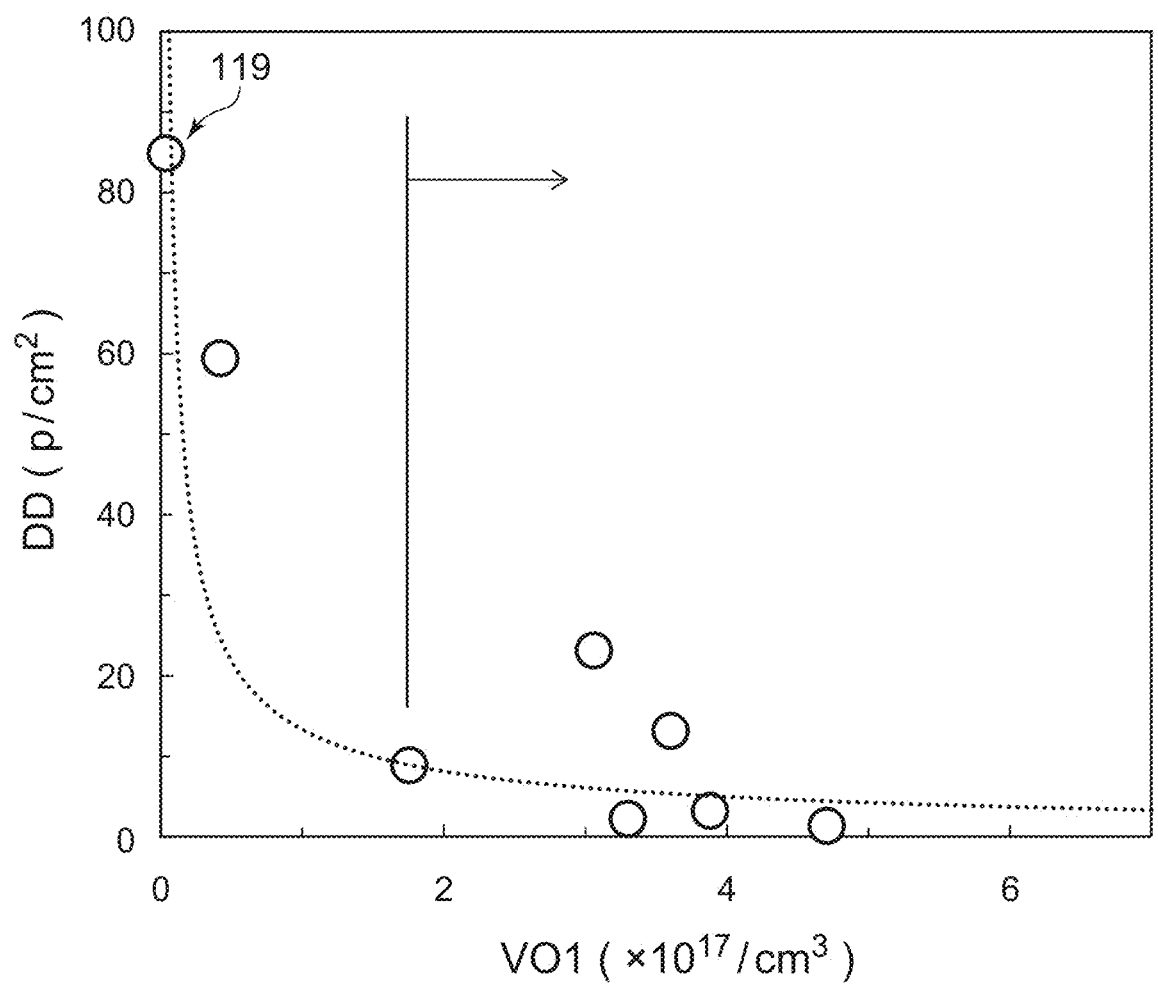
FIG. 6 is a graph illustrating the characteristics of the nitride semiconductor.

FIG. 6 is a graph illustrating the characteristics of the nitride semiconductor.

The horizontal axis of FIG. 6 is the peak value VO1 of the oxygen concentration CO at the first position p1. The vertical axis of FIG. 6 is the defect density DD. FIG. 6 shows a defect density DD in a nitride semiconductor 119 of a reference example. In the nitride semiconductor 119 of the reference example, the intermediate region 11M is not provided. As shown in FIG. 6, when the peak value VO1 of the oxygen concentration CO at the first position p1 becomes high, the defect density DD decreases. When the peak value VO1 is $1.8 \times 10^{17}/cm^3$ or more, the defect density DD becomes critically low. The peak value VO1 is preferably $1.8 \times 10^{17}/cm^3$ or more. The defect density DD can be effectively reduced.

In the embodiment, the peak value VO1 is preferably $5.0 \times 10^{18}/cm^3$ or less. If the peak value VO1 becomes excessively high, pits are likely to occur in the second nitride region 12, and the crystallinity is likely to decrease. When the peak value VO1 becomes excessively high, oxygen becomes a donor impurity in the nitride semiconductor. This makes it easy for current to leak.

Figure 7:
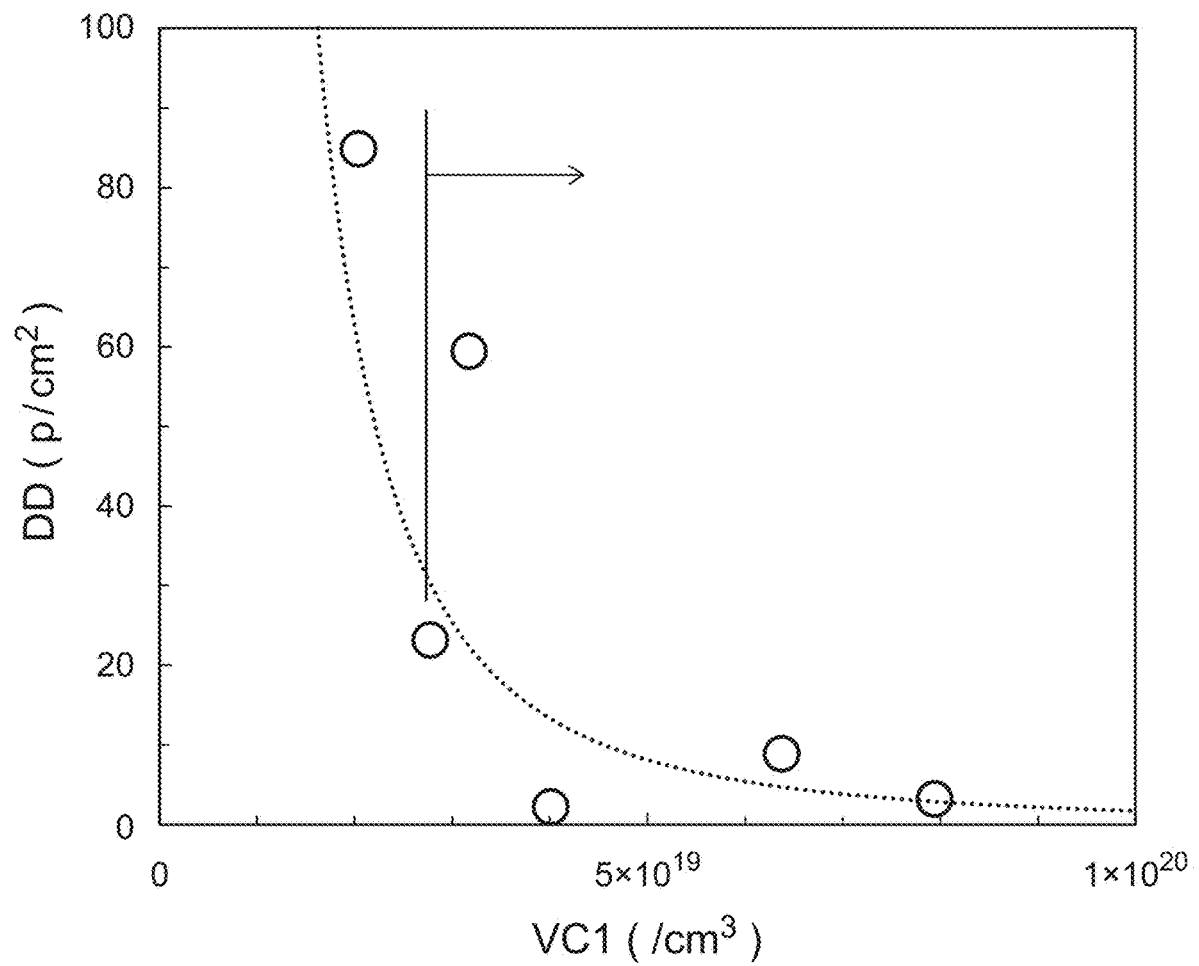
FIG. 7 is a graph illustrating the characteristics of the nitride semiconductor.

FIG. 7 is a graph illustrating the characteristics of the nitride semiconductor.

The horizontal axis of FIG. 7 is the carbon concentration VC1 at the first position p1. The vertical axis of FIG. 7 is the defect density DD. As shown in FIG. 7, when the carbon concentration VC1 at the first position p1 is increased, the defect density DD is reduced. When the concentration VC1 is $2.8 \times 10^{19}/cm^3$ or more, the defect density DD becomes critically low. In the embodiment, the carbon concentration VC1 at the first position p1 is preferably $2.8 \times 10^{19}/cm^3$ or more. Thereby, the defect density DD can be effectively reduced.

In the embodiment, the carbon concentration VC1 at the first position p1 is preferably $2.0 \times 10^{20}/cm^3$ or less. If the carbon concentration VC1 is excessively high, lattice relaxation is likely to occur at the first position p1. As a result, the crystallinity tends to decrease in the second nitride region 12.

In the embodiment, a ratio of the carbon concentration VC1 at the first position p1 to the peak value VO1 is preferably not less than 40 and not more than 200, for example. In this range, it is easy to effectively reduce the defect density.

In the embodiment, the oxygen concentration CO (first oxygen concentration) in the first nitride region 11 is preferably, for example, not less than $1.0 \times 10^{16}/cm^3$ and not more than $5.0 \times 10^{17}/cm^3$. As a result, the occurrence of dislocations can be easily suppressed in the first nitride region 11. It is easy to obtain the first nitride region 11 having high crystallinity.

In the embodiment, the oxygen concentration CO (second oxygen concentration) in the second nitride region 12 is preferably, for example, not less than $5.0 \times 10^{15}/cm^3$ and not more than $1.0 \times 10^{17}/cm^3$. As a result, dislocations are likely to decrease in the second nitride region 12. It is easy to obtain the second nitride region 12 having high crystallinity.

In the embodiment, the carbon concentration CC (first carbon concentration) in the first nitride region 11 is preferably, for example, not less than $5.0 \times 10^{18}/cm^3$ and not more than $1.0 \times 10^{20}/cm^3$. As a result, it is easy to suppress the occurrence of defects in the first nitride region 11. It is easy to obtain the first nitride region 11 with few defects.

In the embodiment, the carbon concentration CC (second carbon concentration) in the second nitride region 12 is preferably, for example, not less than $8.0 \times 10^{18}/cm^3$ and not more than $5.0 \times 10^{20}/cm^3$. As a result, defects are likely to be reduced in the second nitride region 12. It is easy to obtain the second nitride region 12 with few defects.

In the embodiment, the carbon concentration CC (second carbon concentration) in the second nitride region 12 is higher than the carbon concentration CC (first carbon concentration) in the first nitride region 11. This makes it easier to suppress defects that occur in the second nitride region 12.

In the embodiment, the carbon concentration VC1 at the first position p1 is between the first carbon concentration and the second carbon concentration. This makes it easy to obtain the second nitride region 12 with few defects.

In the embodiment, the third nitride region 13 is substantially does not include oxygen. Alternatively, the oxygen concentration CO (third oxygen concentration) in the third nitride region 13 is lower than the oxygen concentration CO (second oxygen concentration) in the second nitride region 12. The oxygen concentration CO (third oxygen concentration) in the third nitride region 13 is, for example, $5.0×10^{15}/cm^3$ or less. This makes it easy to obtain a highly crystalline third nitride region 13.

As already explained, the third nitride region 13 is substantially does not include carbon. Alternatively, the carbon concentration CC in the third nitride region 13 is lower than the carbon concentration CC (second carbon concentration) in the second nitride region 12. The carbon concentration CC in the third nitride region 13 is, for example, $3.0×10^{16}/cm^3$ or less. This makes it easy to obtain the third nitride region 13 with few defects.

The oxygen concentration CO (second oxygen concentration) in the second nitride region 12 is lower than the oxygen concentration CO (first oxygen concentration) in the first nitride region 11. The oxygen concentration CO (third oxygen concentration) in the third nitride region 13 is lower than the oxygen concentration CO (first oxygen concentration) in the first nitride region 11. The oxygen concentration CO (second oxygen concentration) in the second nitride region 12 is, for example, between the third oxygen concentration and the first oxygen concentration.

The carbon concentration CC (second carbon concentration) in the second nitride region 12 is higher than the carbon concentration CC (first carbon concentration) in the first nitride region 11. The second carbon concentration CC2 is higher than the carbon concentration CC (third carbon concentration) in the third nitride region 13.

As shown in FIG. 1, the first nitride region 11 may include a plurality of first layers 11a and a plurality of second layers 11b. In the first direction D1, one of the plurality of first layers 11a is between one of the plurality of second layers 11b and an other one of the plurality of second layers 11b. One of the plurality of second layers 11b is between one of the plurality of first layers 11a and an other one of the plurality of first layers 11a.

The first layers 11a include $Al_{y1}Ga_{1-y1}N$ (0<y1≤1). The first layers 11a include, for example, AlN. The composition ratio of Al in the first layers 11a is preferably not less than 0.75 and not more than 1, for example.

The second layers 11b include $Al_{y2}Ga_{1-y2}N$ (0≤y2<y1). The second layers 11b include, for example, $Al_{0.13}Ga_{0.87}N$. The composition ratio of Al in the second layers 11b is, for example, not less than 0 and not more than 0.6. The composition ratio of Al in the second layers 11b may be, for example, not less than 0.06 and not more than 0.35. The second layers 11b may be a GaN layer.

The effective Al composition ratio (for example, the average Al composition ratio) in the first nitride region 11 corresponds to (y1·ta+y2·tb)/(ta+tb). "ta" is the thickness of one of the first layers 11a. "tb" is the thickness of one of the second layers 11b. The thicknesses are lengths along the first direction D1. The effective composition ratio of Al in the first nitride region 11 is preferably not less than 0.15 and not more than 0.55, for example. The effective composition ratio of Al in the first nitride region 11 may be, for example, not less than 0.18 and not more than 0.28.

As shown in FIG. 1, the nitride semiconductor 110 may further include the base body 18s. The first nitride region 11 is provided between the base body 18s and the second nitride region 12. The base body 18s is, for example, a crystalline substrate. The base body 18s may include, for example, at least one of a silicon substrate, a sapphire substrate, a SiC substrate, or a GaN substrate.

As shown in FIG. 1, the nitride semiconductor 110 may include a fifth nitride region 15. The fifth nitride region 15 includes $Al_{x5}Ga_{1-x5}N$ (0<x5≤1). The fifth nitride region 15 includes, for example, AlN. The composition ratio x5 is preferably, for example, not less than 0.5 and not more than 1.

As shown in FIG. 1, the nitride semiconductor 110 may include a sixth nitride region 16. The sixth nitride region 16 includes $Al_{x6}Ga_{1-x6}N$ (0<x6<1, x6<x5). The sixth nitride region 16 includes, for example, AlGaN. The composition ratio x6 is preferably, for example, not less than 0.1 and not more than 0.8.

The nitride semiconductor 110 may include a fourth nitride region 14. The fourth nitride region 14 includes $Al_{x4}Ga_{1-x4}N$ (0<x4≤1, x3<x4). The third nitride region 13 is provided between the second nitride region 12 and the fourth nitride region 14 in the first direction D1. The fourth nitride region 14 includes, for example, $Al_{0.2}Ga_{0.8}N$. The composition ratio x4 is preferably, for example, not less than 0.05 and not more than 0.35.

For example, the third nitride region 13 includes a region facing the fourth nitride region 14. For example, a carrier region is formed in this region. The carrier region is, for example, a two-dimensional electron gas. In a semiconductor device based on the nitride semiconductor 110, the carrier region is used for the operation of the semiconductor device.

The fourth nitride region 14 does not substantially include oxygen. Alternatively, the oxygen concentration in the fourth nitride region 14 is lower than the oxygen concentration CO (second oxygen concentration) in the second nitride region 12. The fourth nitride region 14 is does not substantially include carbon. Alternatively, the carbon concentration in the fourth nitride region 14 is lower than the carbon concentration CC (second carbon concentration) in the second nitride region 12. The fourth nitride region 14 does not substantially include impurities that bring about conductivity. Impurities that bring about conductivity include, for example, Si or Mg.

The thickness t11 of the first nitride region 11 (see FIG. 1) is preferably, for example, not less than 500 nm and not more than 1000 nm. The thickness ta of one of the first layers 11a is preferably, for example, not less than 2 nm and not more than 15 nm. The thickness tb of one of the second layers 11b is preferably, for example, not less than 15 nm and not more than 40 nm. The thickness t11M (see FIG. 1) of the intermediate region 11M is preferably not less than 5 nm and not more than 40 nm, for example.

The thickness t12 of the second nitride region 12 (see FIG. 1) is preferably, for example, not less than 500 nm and not more than 5000 nm. The thickness t13 (see FIG. 1) of the third nitride region 13 is preferably not less than 100 nm and not more than 2000 nm, for example. The thickness t14 (see FIG. 1) of the fourth nitride region 14 is preferably, for example, not less than 15 nm and not more than 50 nm.

The thickness t15 of the fifth nitride region 15 (see FIG. 1) is preferably, for example, not less than 50 nm and not more than 400 nm. The thickness t16 of the sixth nitride region 16 (see FIG. 1) is preferably, for example, not less than 50 nm and not more than 500 nm. The above thicknesses are lengths along the first direction D1.

In the embodiment, for example, $C_2H_2$ gas including oxygen may be used in the formation of the intermediate region 11M. The oxygen concentration in the $C_2H_2$ gas is, for example, not less than 10 ppm and not more than 30 ppm (for example, 20 ppm).

In the formation of the intermediate region 11M, for example, TMGa including oxygen or TMAl including oxygen may be used. In these cases, when controlling the amount of oxygen supplied, the growth rate changes with the oxygen concentration. When $C_2H_2$ gas including oxygen is used, it is easy to control the oxygen concentration with higher accuracy.

In the embodiment, the oxygen concentration can be changed, for example, by temperature. By lowering the temperature, the concentration of oxygen increases. In embodiments, the oxygen concentration can be varied, for example, with the partial pressure of ammonia. By increasing the partial pressure of ammonia, the concentration of oxygen increases.

In the embodiment, the first nitride region 11 does not have to have a laminated structure. The first nitride region 11 may be a nitride semiconductor layer that does not substantially include Al. In this case, the first nitride region 11 includes GaN. In this case, the composition ratio x1 is 0. Also in this case, the peak value VO1 is 4.9 times or more the oxygen concentration CO (first oxygen concentration) in the first nitride region 11. Also in this case, the peak value VO1 is 18 times or more the oxygen concentration CO (second oxygen concentration) in the second nitride region 12. In embodiments, the intermediate region 11M comprises, for example, a nitride. In embodiments, the intermediate region 11M includes, for example, Ga and nitrogen. The intermediate region 11M may include, for example, Ga, Al and nitrogen.

Second Embodiment

The second embodiment relates to a semiconductor device.

Figure 8:
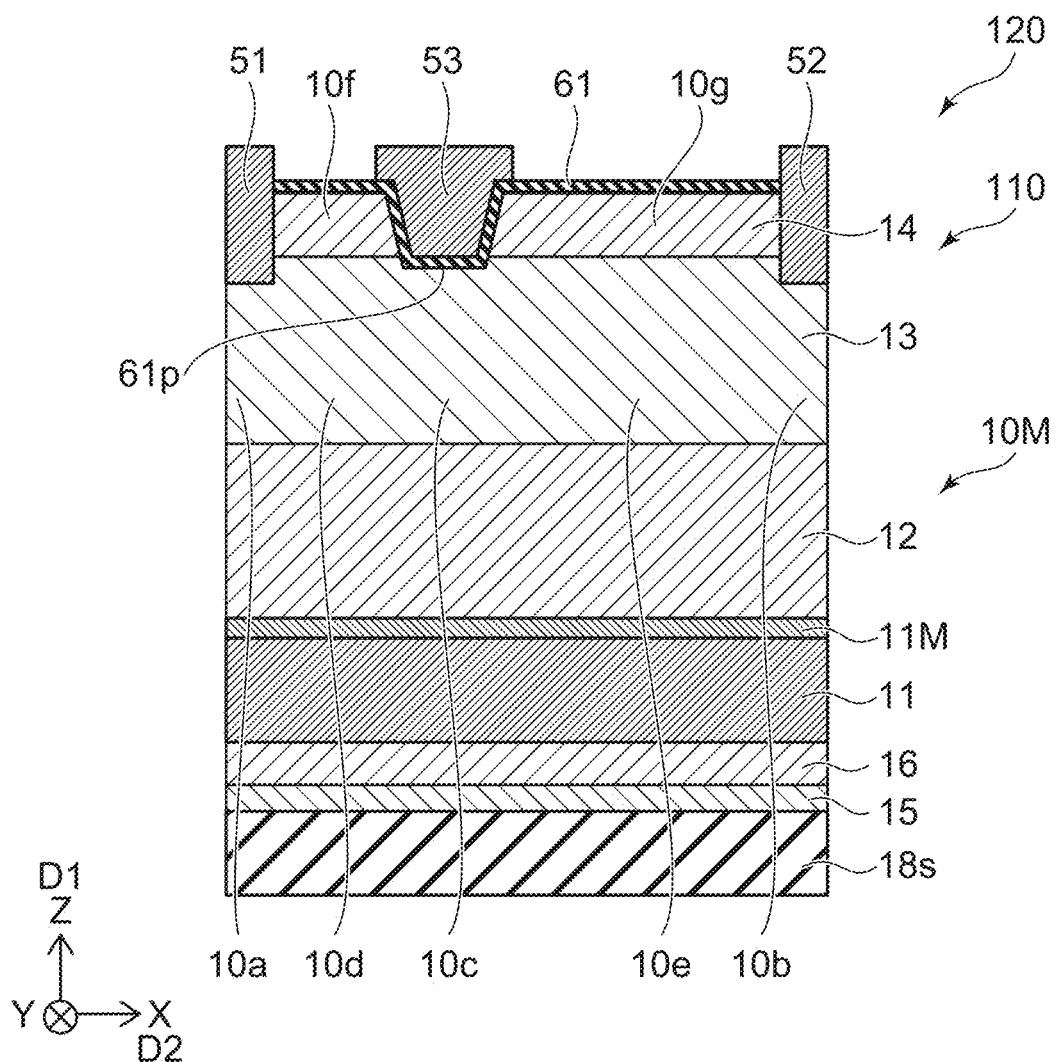
FIG. 8 is a schematic cross-sectional view illustrating the semiconductor device according to the second embodiment.

FIG. 8 is a schematic cross-sectional view illustrating the semiconductor device according to the second embodiment.

As shown in FIG. 8, a semiconductor device 120 according to the embodiment includes the nitride semiconductor 110 according to the first embodiment, a first electrode 51, a second electrode 52, a third electrode 53, and an insulating member 61. A direction from the first electrode 51 to the second electrode 52 is along a second direction D2 that crosses the first direction D1. The second direction D2 is, for example, the X-axis direction. A position of the third electrode 53 in the second direction D2 is between a position of the first electrode 51 in the second direction D2 and a position of the second electrode 52 in the second direction D2.

The nitride member 10M includes the first nitride region 11, the second nitride region 12, the intermediate region 11M, the third nitride region 13 and the fourth nitride region 14. The third nitride region 13 includes a first partial region 10a, a second partial region 10b, a third partial region 10c, a fourth partial region 10d, and a fifth partial region 10e. A direction from the first partial region 10a to the first electrode 51 is along the first direction D1. A direction from the second partial region 10b to the second electrode 52 is along the first direction D1. The third partial region 10c is between the first partial region 10a and the second partial region 10b in the second direction D2. A direction from the third partial region 10c to the third electrode 53 is along the first direction D1. The fourth partial region 10d is between the first partial region 10a and the third partial region 10c in the second direction D2. The fifth partial region 10e is between the third partial region 10c and the second partial region 10b in the second direction D2.

The fourth nitride region 14 includes a sixth partial region 10f and a seventh partial region 10g. A direction from the fourth partial region 10d to the sixth partial region 10f is along the first direction D1. A direction from the fifth partial region 10e to the seventh partial region 10g is along the first direction D1.

The insulating member 61 is located between the nitride member 10M and the third electrode 53. For example, the insulating member 61 includes a first insulating region 61p. The first insulating region 61p is provided between the third partial region 10c and the third electrode 53 in the first direction D1 (Z-axis direction).

The first electrode 51 is electrically connected with the sixth partial region 10f. The second electrode 52 is electrically connected with the seventh partial region 10g.

In the semiconductor device 120, a current flowing between the first electrode 51 and the second electrode 52 can be controlled by a potential of the third electrode 53. The potential of the third electrode 53 is, for example, a potential based on a potential of the first electrode 51. The first electrode 51 functions as, for example, a source electrode. The second electrode 52 functions as, for example, a drain electrode. The third electrode 53 functions as, for example, a gate electrode. The semiconductor device 120 is, for example, a HEMT (High Electron Mobility Transistor).

According to the embodiment, defects can be suppressed. For example, the pits can be suppressed. This makes it possible to suppress current leakage, for example. According to the embodiment, it is possible to provide a semiconductor device having improved characteristics.

In the semiconductor device 120, at least a part of the third electrode 53 is located between the sixth partial region 10f and the seventh partial region 10g in the second direction D2. At least a part of the third electrode 53 may be located between the fourth partial region 10d and the fifth partial region 10e in the second direction D2. The first insulating region 61p may be located between the fourth partial region 10d and the fifth partial region 10e. The semiconductor device 120 is, for example, a normally-off type.

Figure 9:
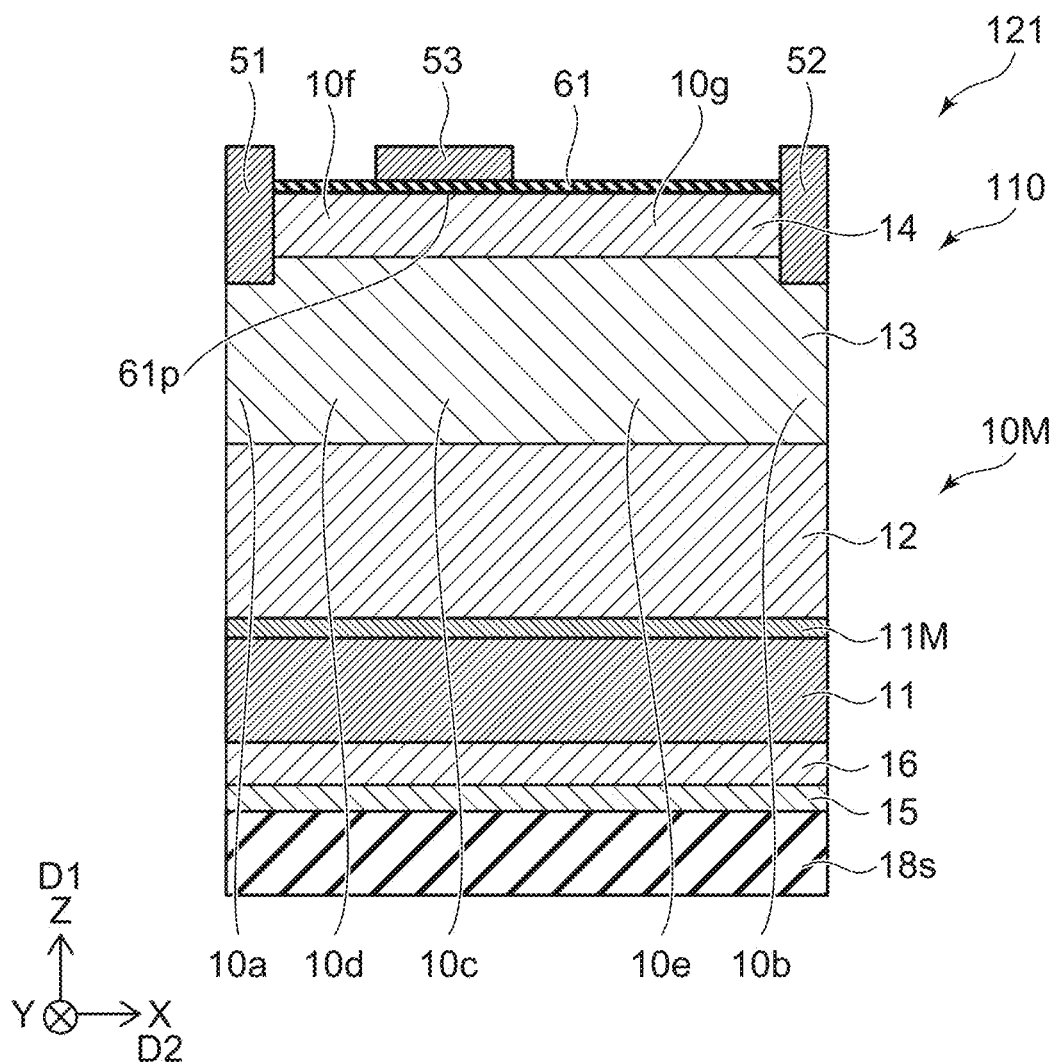
FIG. 9 is a schematic cross-sectional view illustrating the semiconductor device according to the second embodiment.

FIG. 9 is a schematic cross-sectional view illustrating the semiconductor device according to the second embodiment.

As shown in FIG. 9, a semiconductor device 121 according to the embodiment includes the nitride semiconductor 110 according to the first embodiment, the first electrode 51, the second electrode 52, the third electrode 53, and the insulating member 61. In the semiconductor device 121, the third electrode 53 does not overlap the sixth partial region 10f and the seventh partial region 10g in the second direction D2. The third electrode 53 does not overlap the fourth partial region 10d and the fifth partial region 10e in the second direction D2. The semiconductor device 121 is, for example, of a normally-on type. Defects can also be suppressed in the semiconductor device 121. For example, current leakage can be suppressed. A semiconductor device capable of improving characteristics is provided.

In the embodiment, information regarding the shape of the nitride region and the like can be obtained by, for example, electron microscope observation. Information on the composition and element concentration in the nitride region can be obtained by, for example, EDX (Energy Dispersive X-ray Spectroscopy) or SIMS (Secondary Ion Mass Spectrometry). Information on the composition in the nitride region may be obtained, for example, by X-ray reciprocal lattice space mapping.

According to the embodiment, it is possible to provide a nitride semiconductor and a semiconductor device having improved characteristics.

In the specification of the present application, the "state of being electrically connected" includes a state in which a plurality of conductors are physically in contact with each other and a current flows between the plurality of conductors. The "electrically connected state" includes a state in which another conductor is inserted between the plurality of conductors and a current flows between the plurality of conductors.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in nitride semiconductors and semiconductor devices such as nitride regions and base bodies, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nitride semiconductors and semiconductor devices practicable by an appropriate design modification by one skilled in the art based on nitride semiconductors and semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor, comprising:
a nitride member, comprising:
a first nitride region including $Al_{x1}Ga_{1-x1}N$ ($0<x1\leq1$);
a second nitride region including $Al_{x2}Ga_{1-x2}N$ ($0\leq x2<1$); and
an intermediate region between the first nitride region and the second nitride region, wherein
an oxygen concentration in a direction from the first nitride region to the second nitride region has a peak value at a position within the intermediate region,
the peak value is 4.9 times or more of an oxygen concentration in the first nitride region,
a carbon concentration in the second nitride region is higher than a carbon concentration in the first nitride region, and
a concentration of carbon at the oxygen concentration peak value position is greater than the carbon concentration of the first nitride region and less than the carbon concentration of the second nitride region.

2. The semiconductor according to claim 1, wherein a concentration of carbon at the oxygen concentration peak value position is not less than $2.8\times10^{19}/cm^3$ and not more than $2.0\times10^{20}/cm^3$.

3. The semiconductor according to claim 1, wherein a ratio of a carbon concentration at the oxygen concentration peak value position to the oxygen concentration peak value is not less than 40 and not more than 200.

4. The semiconductor according to claim 1, wherein
the carbon concentration of the first nitride region is not less than $5.0\times10^{18}/cm^3$ and not more than $1.0\times10^{20}/cm^3$, and
the carbon concentration of the second nitride region is not less than $8.0\times10^{18}/cm^3$ and not more than $5.0\times10^{20}/cm^3$.

5. The semiconductor according to claim 1, wherein the peak value of oxygen concentration is 18 times or more the oxygen concentration in the second nitride region.

6. The semiconductor according to claim 1, wherein the peak value of oxygen concentration is $1.8\times10^{17}/cm^3$ or more.

7. The semiconductor according to claim 1, wherein
the intermediate region comprises aluminum,
a concentration of aluminum in the oxygen concentration peak value position is lower than a first an aluminum concentration in the first nitride region, and
the second nitride region does not include aluminum, or an aluminum concentration in the second nitride region is less than or equal to the concentration of aluminum in the oxygen concentration peak value position.

8. The semiconductor according to claim 1, wherein
the first nitride region comprises a plurality of first layers and a plurality of second layers,
in the direction from first nitride region to the second nitride region, one of the first layers is between one of the second layers and an other one of the second layers, the one of the second layers is between the one of the first layers and an other one of the first layers,
the first layers comprise $Al_{y1}Ga_{1-y1}N$ ($0<y1\leq1$), and
the second layers comprise $Al_{y2}Ga_{1-y2}N$ ($0\leq y2<y1$).

9. The semiconductor according to claim 1,
further comprising:
a third nitride region comprising $Al_{x3}Ga_{1-x3}N$ ($0\leq x3<1$), wherein
the second nitride region is between the intermediate region and the third nitride region in the direction from first nitride region to the second nitride region, and
the third nitride region does not include carbon, or a carbon concentration of the third nitride region is lower than the second carbon concentration.

10. The semiconductor according to claim 9, further comprising a base body, wherein
the first nitride region is between the base body and the second nitride region.

11. The semiconductor according to claim 9, further comprising a fourth nitride region including $Al_{x4}Ga_{1-x4}N$ ($0<x4\leq1$, $x3<x4$), wherein
the third nitride region is between the second nitride region and the fourth nitride region in the direction from first nitride region to the second nitride region.

12. A semiconductor device comprising:
the nitride semiconductor according to claim 11;
a first electrode;
a second electrode;
a third electrode; and
an insulating member, wherein
a direction from the first electrode to the second electrode is along a second direction crossing the first direction from first nitride region to the second nitride region,
a position of the third electrode in the second direction is between a position of the first electrode in the second direction and a position of the second electrode in the second direction, the third nitride region comprises a first partial region, a second partial region, a third partial region, a fourth partial region, and a fifth partial region, a direction from the first partial region to the first electrode is along the direction from first nitride region to the second nitride region, a direction from the second partial region to the second electrode is along the direction from first nitride region to the second nitride region, the third partial region is located between the first partial region and the second partial region in the second direction, and a direction from the third partial region to the third electrode is along the direction from first nitride region to the second nitride region, the fourth partial region is located between the first partial region and the third partial region in the second direction, the fifth partial region is located between the third partial region and the second partial region in the second direction, the fourth nitride region comprises a sixth partial region and a seventh partial region, a direction from the fourth partial region to the sixth partial region is along the first direction from first nitride region to the second nitride region, a direction from the fifth partial region to the seventh partial region is along the first direction from first nitride region to the second nitride region, and the insulating member is between the nitride member and the third electrode.

13. The device according to claim 12, wherein at least a portion of the third electrode is located between the sixth partial region and the seventh partial region in the second direction.

14. A nitride semiconductor, comprising:
a nitride member, comprising:
a first nitride region including $Al_{x1}Ga_{1-x1}N$ ($0<x1\leq1$);
a second nitride region including $Al_{x2}Ga_{1-x2}N$ ($0\leq x2<1$); and
an intermediate region between the first nitride region and the second nitride region, wherein an oxygen concentration in a direction from the first nitride region to the second nitride region has a peak value at a position within in the intermediate region, the peak value is 4.9 times or more of an oxygen concentration in the first nitride region, wherein the intermediate region comprises aluminum, a concentration of aluminum in the oxygen concentration peak value position is lower than an aluminum concentration in the first nitride region, and the second nitride region does not comprise aluminum, or an aluminum concentration in the second nitride region is less than or equal to the concentration of aluminum in the oxygen concentration peak value-position.

15. The semiconductor according to claim 14, wherein the oxygen concentration peak value is 18 times or more an oxygen concentration in the second nitride region.

16. The semiconductor according to claim 14, wherein the oxygen concentration peak value is $1.8\times10^{17}/cm^3$ or more.

17. The semiconductor according to claim 16, wherein the oxygen concentration peak value is $5.0\times10^{18}/cm^3$ or less.

18. The semiconductor according to claim 14, wherein
the first nitride region comprises a plurality of first layers, and a plurality of second layers, in the direction from the first nitride layer to the second nitride layer, one of the first layers is between one of the second layers and an other one of the second layers, and the one of the second layers is between the one of the first layers and an other one of the first layers, the first layers comprise $Al_{y1}Ga_{1-y1}N$ ($0<y1\leq1$), and
the second layers comprise $Al_{y2}Ga_{1-y2}N$ ($0\leq y2<y1$).

19. The semiconductor according to claim 14, further comprising a third nitride region including $Al_{x3}Ga_{1-x3}N$ ($0\leq x3<1$), wherein the second nitride region is located between the intermediate region and the third nitride region in the direction from the first nitride layer to the second nitride layer, and the third nitride region does not comprise carbon, or a concentration of carbon in the third nitride region is lower than a concentration of carbon in the second nitride region.

* * * * *